(12) United States Patent
Kang et al.

(10) Patent No.: US 11,594,537 B2
(45) Date of Patent: Feb. 28, 2023

(54) 3-D DRAM CELL WITH MECHANICAL STABILITY

(71) Applicant: Applied Materials, Inc., Santa Clara, CA (US)

(72) Inventors: Chang Seok Kang, Santa Clara, CA (US); Tomohiko Kitajima, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 17/354,254

(22) Filed: Jun. 22, 2021

(65) Prior Publication Data

US 2022/0005810 A1   Jan. 6, 2022

Related U.S. Application Data

(60) Provisional application No. 63/048,494, filed on Jul. 6, 2020.

(51) Int. Cl.
  *H01L 27/108* (2006.01)
(52) U.S. Cl.
  CPC .... *H01L 27/10805* (2013.01); *H01L 27/1085* (2013.01); *H01L 27/10873* (2013.01); *H01L 27/10885* (2013.01)
(58) Field of Classification Search
  None
  See application file for complete search history.

(56) References Cited

U.S. PATENT DOCUMENTS

| 10,192,775 | B2 | 1/2019 | Manna et al. |
| 10,573,522 | B2 | 2/2020 | Jandl et al. |
| 10,790,287 | B2 | 9/2020 | Kang et al. |
| 2008/0102578 | A1 | 5/2008 | Schlosser |
| 2008/0217775 | A1 | 9/2008 | Pai |
| 2008/0311711 | A1 | 12/2008 | Hampp et al. |
| 2009/0075454 | A1 | 3/2009 | Ang |
| 2014/0085959 | A1 | 3/2014 | Saraswat et al. |
| 2017/0018301 | A1 | 1/2017 | Kilmer et al. |
| 2018/0323199 | A1 | 11/2018 | Roberts et al. |
| 2018/0331073 | A1 | 11/2018 | Sekar et al. |
| 2019/0181222 | A1* | 6/2019 | Liao ................. H01L 21/32139 |
| 2020/0251151 | A1 | 8/2020 | Kang et al. |

FOREIGN PATENT DOCUMENTS

KR     20180019487 A     2/2018

* cited by examiner

*Primary Examiner* — Nicholas J Tobergte
*Assistant Examiner* — Kevin Quinto
(74) *Attorney, Agent, or Firm* — Servilla Whitney LLC

(57) ABSTRACT

Described are memory devices having stacked DRAM cells, resulting in an increase in DRAM cell bit-density. The area of a unit cell is composed of a capacitor, a cell transistor, an isolation region and a connection region, where every capacitor and active region for the cell capacitor is electrically isolated. The memory cells have supporting bars. Methods of forming a memory device are described. The methods include patterning the isolation region with supporting bars, removing non-insulator layers after isolation region patterning, and filling the opened region with an insulator.

19 Claims, 14 Drawing Sheets

3-D DRAM CELL WITH MECHANICAL STABILITY

CROSS-REFERENCE TO RELATED APPLICATIONS

This application claims priority to U.S. Provisional Application Ser. No. 63/048,494, filed Jul. 6, 2020, the entire disclosure of which is hereby incorporated by reference herein.

TECHNICAL FIELD

Embodiments of the present disclosure pertain to the field of electronic devices and electronic device manufacturing. More particularly, embodiments of the disclosure provide a three-dimensional (3D) dynamic random-access memory cell having a reduced unit area.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices In a 3D-DRAM with stacked unit cell layers, it is necessary to reduce the area of a unit cell in order to increase bit density per unit area for a given number of stacked cells. The area of a unit cell is composed of capacitor, cell transistor, isolation, and connection region (contact and metallization). Therefore, there is a need in the art for memory devices and methods of forming memory devices that have a reduced unit cell area.

SUMMARY

One or more embodiments of the disclosure are directed to memory devices. In an embodiments, a memory device comprises: a first memory cell, a first active region, a first word line, a first capacitor, and a first bit line, the first memory cell extending along a first direction, a second direction, and a third direction; and a second memory cell, a second active region, a second word line, a second capacitor, and a second bit line, the second memory extending along the first direction, the second direction, and the third direction, the second memory cell adjacent to and electrically isolated from the first memory cell along the first direction and connected to the first memory cell by at least one support extending in the second direction.

Additional embodiments of the disclosure are directed to methods of forming a memory device. In one or more embodiments, a method of forming a memory device comprises: forming a memory stack, the memory stack extending along a first direction, a second direction, and a third direction and comprising a sacrificial layer, and alternating layers of a first material layer, a second material layer, and a semiconductor material layer; and patterning the memory stack along the first direction to form at least one support extending along the second direction, the at least one support comprising the sacrificial layer, the first material layer, the second material layer, and the semiconductor material layer.

Further embodiments of the disclosure are directed to a non-transitory computer readable medium including instructions, that, when executed by a controller of a processing chamber, causes the processing chamber to perform the operations of: form a memory stack, the memory stack extending along a first direction, a second direction, and a third direction and comprising a sacrificial layer, and alternating layers of a first material layer, a second material layer, and a semiconductor material layer; and pattern the memory stack along the first direction to form at least one support extending along the second direction, the at least one support comprising the sacrificial layer, the first material layer, the second material layer, and the semiconductor material layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
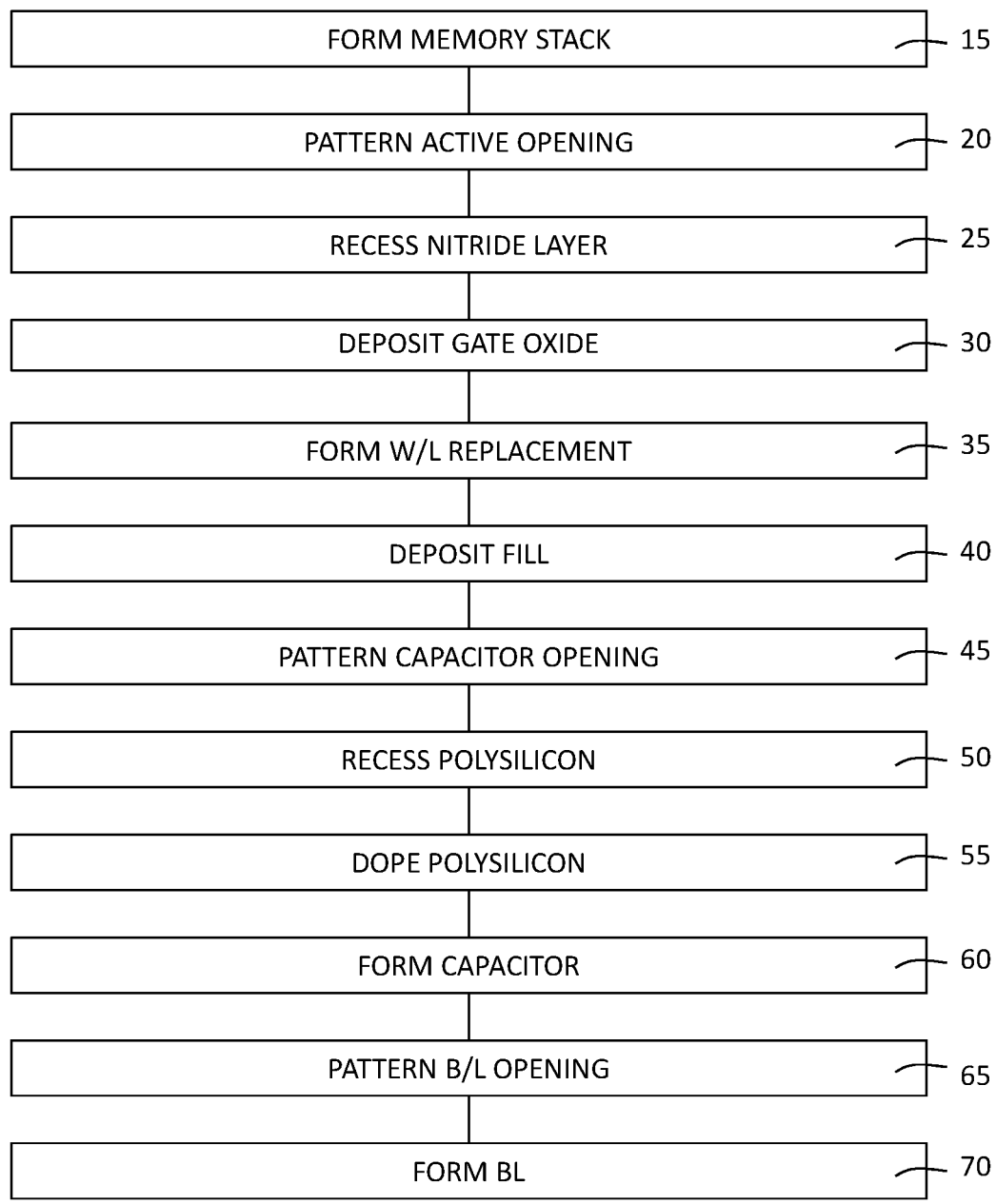
FIG. 1 illustrates a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells.

Traditionally, DRAM cells have recessed high work-function metal structures in buried word line structure. In a DRAM device, a bit line is formed in a metal level situated above the substrate, while the word line is formed at the polysilicon gate level at the surface of the substrate. In the buried word line (bWL), a word line is buried below the surface of a semiconductor substrate using a metal as a gate electrode.

In one or more embodiments, memory devices are provided which have stacked DRAM cells, resulting in an increase in DRAM cell bit-density. In a 3D DRAM with stacked unit cell layers of one or more embodiments, it is necessary to reduce the area of a unit cell in order to increase bit density per unit area for a given number of stacked cells. In one or more embodiments, the area of a unit cell is composed of a capacitor, a cell transistor, an isolation region and a connection region (contact and metallization). In one or more embodiments, every capacitor and active region for the cell capacitor is advantageously electrically isolated. In one or more embodiments, the mold stack is divided into individual cell regions in an x or y direction by high aspect ratio (HAR) patterning.

Some embodiments advantageously provide memory devices and methods of forming memory devices with increased mechanical stability. Some embodiments advantageously provide memory arrays with supporting bars. Some embodiments advantageously provide a method of forming a memory device that includes patterning the isolation region with supporting bars, removing non-insulator layers after isolation region patterning, and filling the opened region with an insulator.

In one or more embodiments, metal deposition and other processes can be carried out in an isolated environment (e.g., a cluster process tool). Accordingly, some embodiments of the disclosure provide integrated tool systems with related process modules to implement the methods.

FIG. 1 illustrates a process flow diagram for a method 10 that can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, an active opening is patterned into the memory stack. At operation 25, the first material layer, e.g. nitride layers, may be recessed through the active opening. At operation 30, a gate oxide is deposited. At operation 35, a word line replacement is formed. At operation 40, an oxide is deposited. At operation 45, the capacitor opening is patterned. At operation 50, the semiconductor material layer is recessed through the capacitor opening. At operation 55, the semiconductor material layer is doped. At operation 60, a capacitor is formed. At operation 65, to bit line opening is patterned. At operation 70, a bit line is formed.

FIGS. 2A through 2H illustrate isometric views of a memory device according to one or more embodiments. FIGS. 3A through 3R illustrate cross-sectional views of a memory device according to one or more embodiments.

Figure 2A:
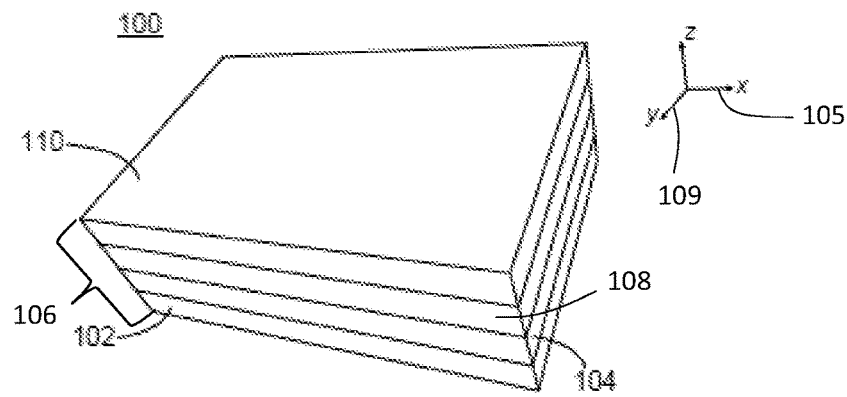
FIGS. 2A through 2H illustrate isometric views of a memory device according to one or more embodiments of the disclosure.
Figure 3A:
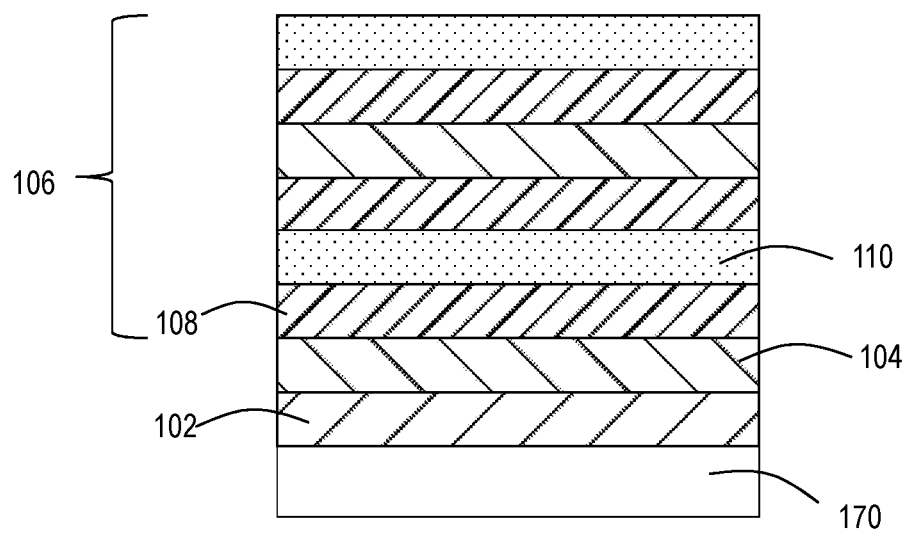
FIGS. 3A through 3Q illustrate cross-sectional views of a memory device according to one or more embodiments of the disclosure.

With reference to FIGS. 2A and 3A, an initial or starting mold of an electronic device 100 is formed in accordance with one or more embodiments of the disclosure. In some embodiments, the electronic device 100 shown in FIG. 2A is formed on a bare substrate (not illustrated) in layers. The electronic device of FIG. 2A is made up of a substrate 170, a first sacrificial layer 102, a second sacrificial layer 104, and a memory stack 106.

The substrate 170 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

In one or more embodiments, a first sacrificial layer 102 is on a substrate, and a second sacrificial layer 104 is on the first sacrificial layer 102. The first sacrificial layer 102 may comprise any suitable material known to the skilled artisan. In one or more embodiments, the first sacrificial layer 102 comprises an insulating layer. In one or more embodiments, the first sacrificial layer 102 comprises silicon nitride (SiN).

The second sacrificial layer 104 may also be referred to as the semiconductor material layer or the active layer. As used herein, the term "active" or "memory layer" refers to a layer of material in which a channel, a bit line, a word line, or a capacitor can be made. In one or more embodiments, the active layer comprises one or more of silicon or doped silicon.

The second sacrificial layer 104 can be formed by any suitable technique known to the skilled artisan and can be made from any suitable material. In some embodiments, the semiconductor material may be a doped material, such as n-doped silicon (n-Si), or p-doped silicon (p-Si). In some embodiments, the semiconductor material may be doped using any suitable process such as an ion implantation process. As used herein, the term "n-type" refers to semiconductor material layer that is created by doping with an electron donor element during manufacture. The term n-type comes from the negative charge of the electron. In n-type semiconductor material layers, electrons are the majority carriers and holes are the minority carriers. As used herein, the term "p-type" refers to the positive charge of a well (or hole). As opposed to n-type semiconductor materials, p-type semiconductor materials have a larger hole concentration than electron concentration. In p-type semiconductor materials, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the second sacrificial layer 104 comprises several different conductive or a semiconductor materials.

The first sacrificial layer 102 and the second sacrificial layer 104 may formed on a substrate 170 and can be made of any suitable material. In some embodiments, one or more of the first sacrificial layer 102 and the second sacrificial layer 104 may be removed and replaced in later processes. In some embodiments, one or more of the first sacrificial layer 102 and the second sacrificial layer 104 are not removed and remain within the memory device 100. In this case, the term "sacrificial" has an expanded meaning to include permanent layers and may be referred to as the conductive layer. In one or more embodiments, one or more of the first sacrificial layer 102 and the second sacrificial layer 104 comprise a material that can be removed selectively versus the layers of the neighboring memory stack 106.

The memory stack 106 in the illustrated embodiment comprises a plurality of alternating first material layers 108, second material layers 110, first sacrificial layers 102, and second sacrificial layers 104. While the memory stack 106, illustrated in FIG. 2A, has a single set of alternating first material layers 108, second material layers 110, first material layers 108, second material layers 110, first sacrificial layers 102, and second sacrificial layers 104, one of skill in the art recognizes that this is merely for illustrative purposes only. The memory stack 106 may have any number of alternating first material layers 108, second material layers 110, first sacrificial layers 102, and second sacrificial layers 104. For example, in some embodiments, the memory stack 106 comprises 192 pairs of alternating first material layers 108, second material layers 110, first sacrificial layers 102, and second sacrificial layers 104. In other embodiments, the memory stack 106 comprises greater than 50 pairs of alternating first material layers 108, second material layers 110, first sacrificial layers 102, and second sacrificial layers 104, or greater than 100 pairs of alternating first material layers 108, second material layers 110, first sacrificial layers 102, and second sacrificial layers 104, or greater than 300 pairs of alternating first material layers 108, second material layers 110, first sacrificial layers 102, and second sacrificial layers 104.

In one or more embodiments, sequential depositions are used to form many active area regions. In one or more embodiments, alternating layers of films, e.g. oxide-polysilicon, polysilicon-nitride, oxide-nitride, silicon-silicon germanium, are deposited.

In one or more embodiments, the first material layers 108 and the second material layers 110 independently comprise an insulating material. In one or more embodiments, the first material layers 108 comprise nitride layers and the second material layers 106 comprise oxide layers. In some embodiments, the memory stack 106 comprises a non-replacement gate such as alternating oxide and poly-silicon (OP), or oxide and metal, or oxide and sacrificial layer. The second layers 110 comprise a material that is etch selective relative to the first layers 108 so that the second layers 110 can be removed without substantially affecting the first layers 108. In one or more embodiments, the first layers 108 comprise silicon nitride (SiN). In one or more embodiments, the second layers 110 comprise silicon oxide ($SiO_x$). In one or more embodiments first layers 108 and second layers 110 are deposited by chemical vapor deposition (CVD) or physical vapor deposition (PVD).

The individual alternating layers may be formed to any suitable thickness. In some embodiments, the thickness of each second layer 110 is approximately equal. In one or more embodiments, each second layer 110 has a second layer thickness. In some embodiments, the thickness of each first layer 108 is approximately equal. As used in this regard, thicknesses which are approximately equal are within +/−5% of each other. In some embodiments, a silicon layer (not shown) is formed between the second layers 110 and first layers 108. The thickness of the silicon layer may be relatively thin as compared to the thickness of a layer of second layers 110 or first layers 108. In one or more embodiments, the first layers 108 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first layer 108 has a thickness in the range of from about 0.5 to about 40 nm. In one or more embodiments, the second layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layer 110 has a thickness in the range of from about 0.5 to about 40 nm.

Figure 2B:
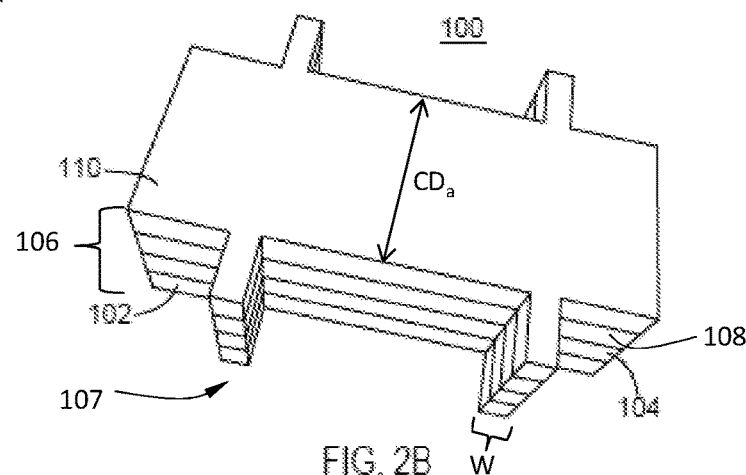

Referring to FIG. 2B, the electronic device 100 is patterned in a first direction 105 (e.g. x-direction) to form at least one support 107 extending along a second direction 109 (e.g. y-direction). The at least one support 107 has a width, W. In one or more embodiments, the width, W, is in a range of from about 10 nm to about 200 nm. In one or more embodiments, the patterned device has a critical dimension, $CD_a$, in a range of from about 50 nm to about 500 nm.

Figure 2C:
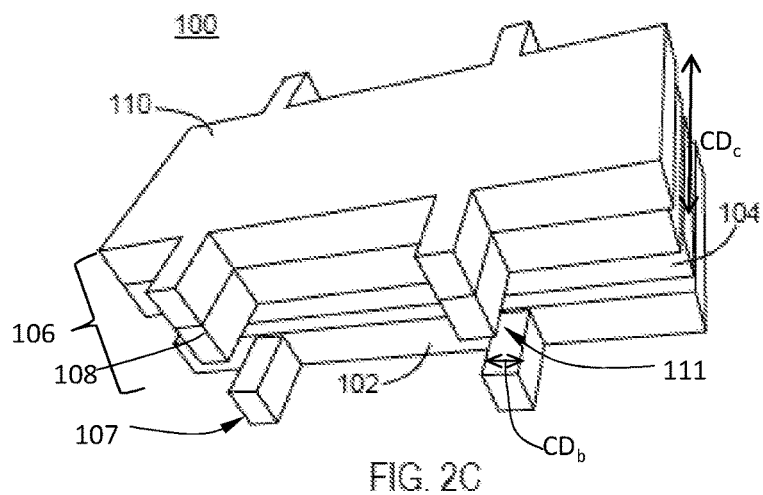

With reference to FIG. 2C, at least a portion of the non-insulator second sacrificial layer 104 is removed by etching to form an opening 111. In one or more embodiments, the second sacrificial layer 104 is removed from the at least one support 107. In one or more embodiments, the critical dimension of the active region $CD_c$ is equal to the critical dimension, $CD_a$, of the patterned device less the critical dimension, $CD_b$, of the at least one support. In one or more embodiments, the critical dimension of the active region $CD_b$ is in a range of from about 50 nm to about 500 nm. In one or more embodiments, the critical dimension, $CD_b$, of the at least one support 107 is the same as the width, W, of the at least one support 107. In some embodiments, the etch amount of the second sacrificial layer 104 to remove the second sacrificial layer 104 in the at least one support 107 is about one-half the critical dimension, $CD_b$, of the at least one support 107.

Figure 2D:
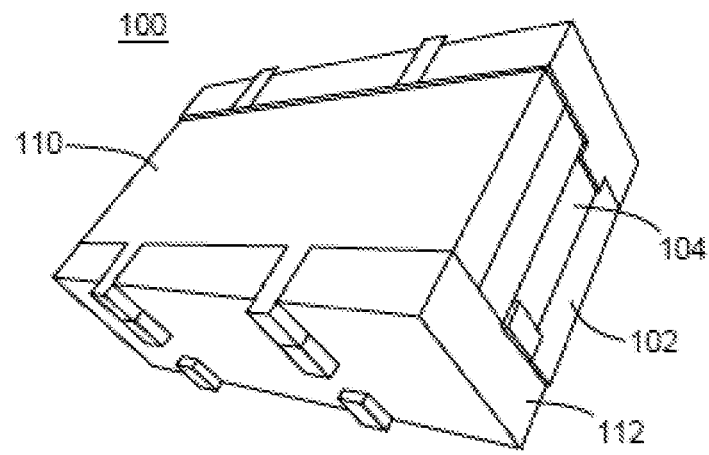

Referring to FIG. 2D, in one or more embodiments, an insulator layer 112 is deposited and fills the opening 111. The insulator layer 112 may comprise any suitable material known to the skilled artisan. In some embodiments, the insulator layer 112 comprises a dielectric material. As used herein, the term "dielectric material" refers to an electrical insulator that can be polarized in an electric field. In some embodiments, the insulator layer 112 comprises one or more of oxides, carbon doped oxides, silicon dioxide (SiO), porous silicon dioxide ($SiO_2$), silicon dioxide (SiO), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In a specific embodiment, the insulator layer 112 comprises silicon oxide ($SiO_x$).

Figure 2E:
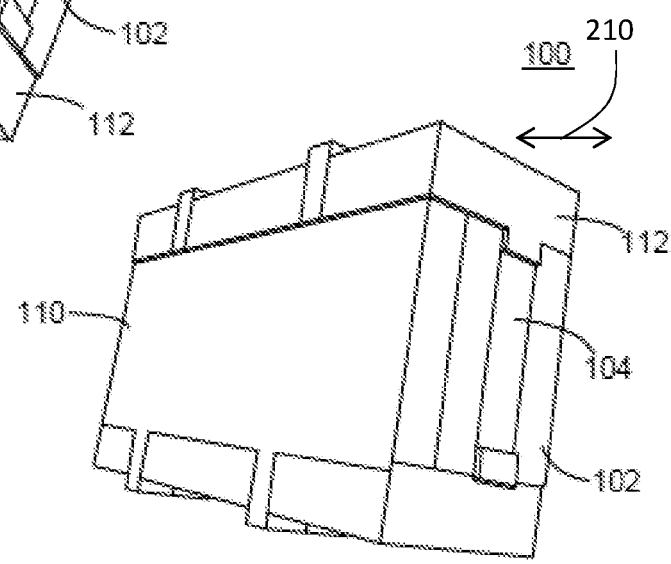
Figure 3B:
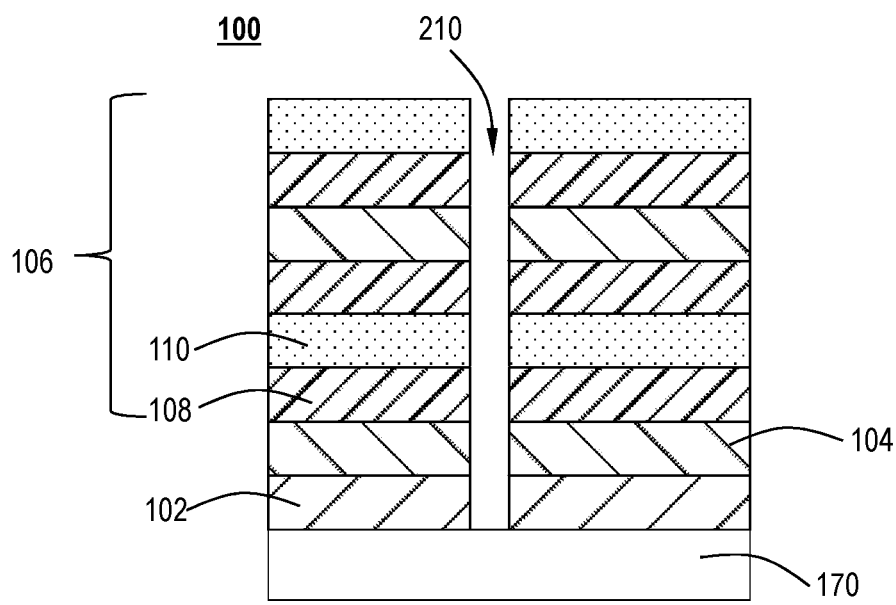

Referring to FIGS. 2E and 3B, the device is slit patterned to form an active opening 210. In some embodiments, patterning the active opening 150 comprises etching through the memory stack 106, first sacrificial layer 102, second sacrificial layer 104, and into substrate 170. Referring to FIG. 3B, the active opening 210 has sidewalls that extend through the memory stack 106 exposing surfaces of the second material layers 110 and surfaces of the first material layers 108.

The first sacrificial layer 102 and the second sacrificial layer 104 have surfaces exposed as sidewalls of the active opening 210. The active opening 210 extends a distance into the substrate 170 so that sidewall surface and bottom of the active opening 210 are formed within the substrate 170. The bottom of the active opening 210 can be formed at any point within the thickness of the substrate 170. In some embodiments, the active opening 210 extends a thickness into the substrate 170 in the range of from about 10% to about 90%, or in the range of from about 20% to about 80%, or in the range of from about 30% to about 70%, or in the range of from about 40% to about 60% of the thickness of the substrate 102. In some embodiments, the active opening 210 extends a distance into the substrate 170 by greater than or equal to 10%, 20%, 30%, 40%, 50%, 60%, 70% or 80% of the thickness of the substrate 170.

Figure 2F:
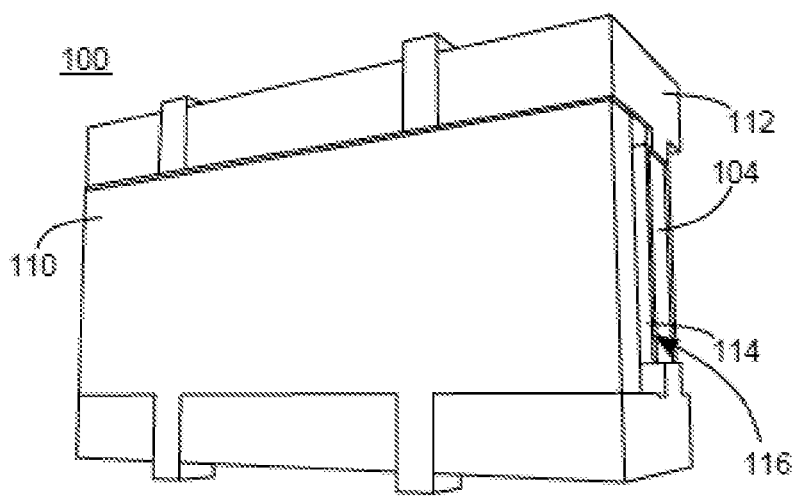
Figure 2G:
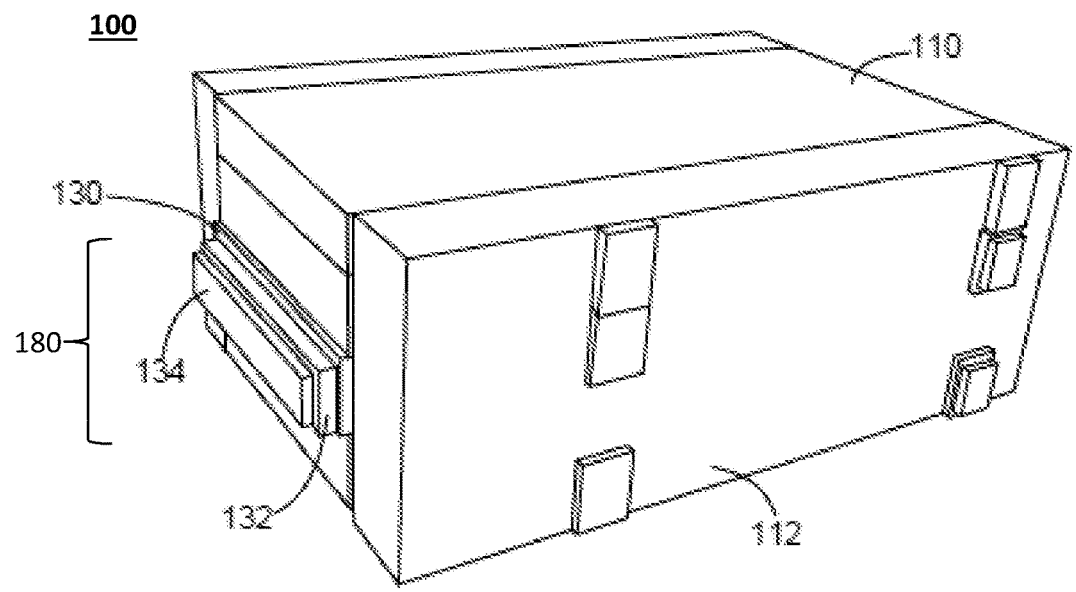
Figure 3C:
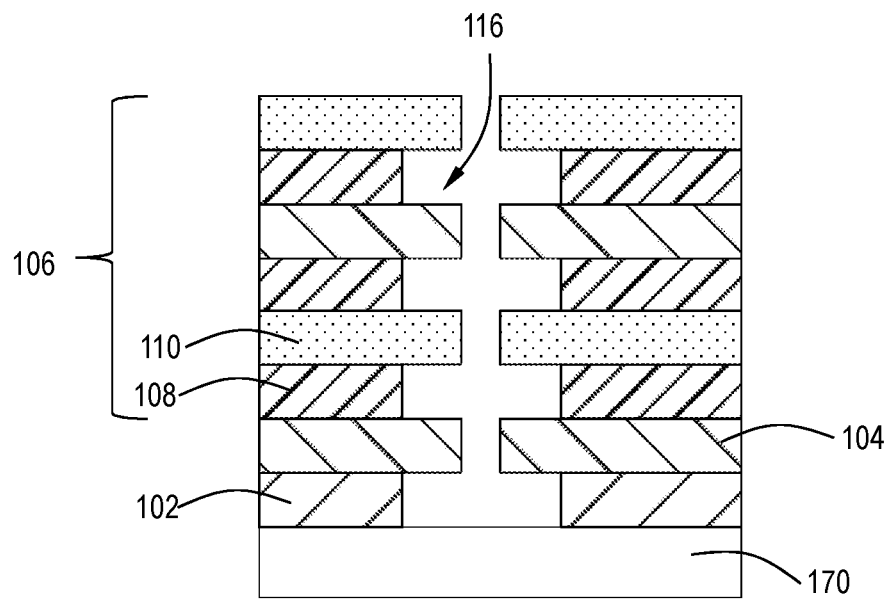

Referring to FIG. 2F and FIG. 3C, the first sacrificial layer 102 and the first material layers 108, e.g. nitride layers, are selectively recessed through the active opening 210 to form a recessed region 116. In one or more embodiments, the second material layers 110, e.g. nitride layers, are recessed through the active opening 210 using a reactive species that is formed via a remote plasma from a process gas comprising oxygen ($O_2$) and nitrogen trifluoride ($NF_3$). In other embodiments, the second material layers 110, e.g. nitride layers, are recessed through the active opening 210 using hot phosphorus (HP).

Figure 3D:
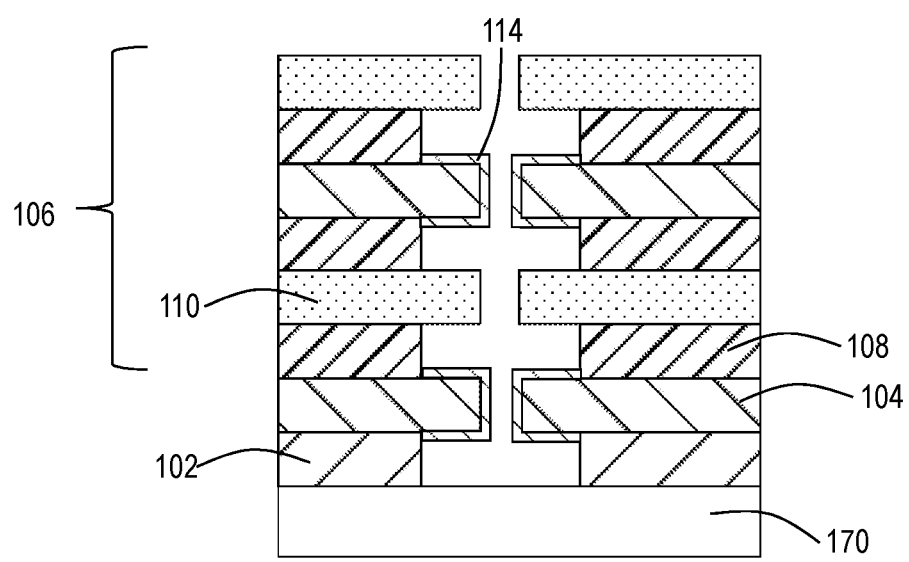

With reference to FIGS. 2F and 3D, a gate oxide layer 114 is deposited through the active opening 210 onto the second sacrificial layer 104. The gate oxide layer 114 may comprise any suitable material known to the skilled artisan. The gate oxide layer 114 can be deposited using one or more deposition techniques known to the skilled artisan. In one or more embodiments, the gate oxide layer 114 is deposited using one of deposition techniques, such as, but not limited to, ALD, CVD, PVD, MBE, MOCVD, spin-on, or other deposition techniques known to the skilled artisan. The illustrated embodiment shows the gate oxide layer 114 as a conformal layer with a uniform shape. However, the skilled artisan will recognize that this is merely for illustrative purposes and that the gate oxide layer 114 can form in an isotropic manner so that the gate oxide layer 114 has a rounded appearance. In some embodiments, the gate oxide layer 114 is selectively deposited as a conformal layer on the surface of the second sacrificial layer 104. In some embodiments, the gate oxide 140 is formed by oxidation of the semiconductor surface.

In one or more embodiments, gate oxide layer 114 comprises a silicon oxide ($SiO_x$). While the term "silicon oxide" may be used to describe the gate oxide layer 114, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Figure 3E:
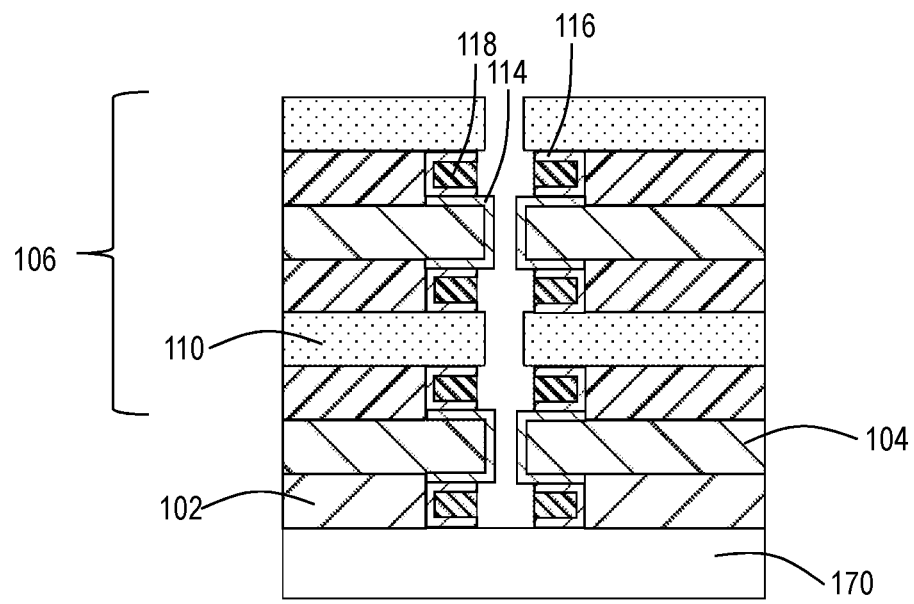

Referring to FIG. 3E, the word lines are formed. The word lines comprise one or more of a barrier layer 116 and a word line metal 118. The oxide layer 114 may comprise any suitable material known to the skilled artisan. The barrier layer 116 may comprise any suitable material known to the skilled artisan. In one or more embodiments, the barrier layer 116 comprises one or more of titanium nitride (TiN), tantalum nitride (TaN), or the like. In one or more embodiments, the word line metal 118 comprises a bulk metal comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). In one or more embodiments, the word line metal 118 comprises tungsten (W). In other embodiments, the word line metal 184 comprises ruthenium (Ru).

Figure 3F:
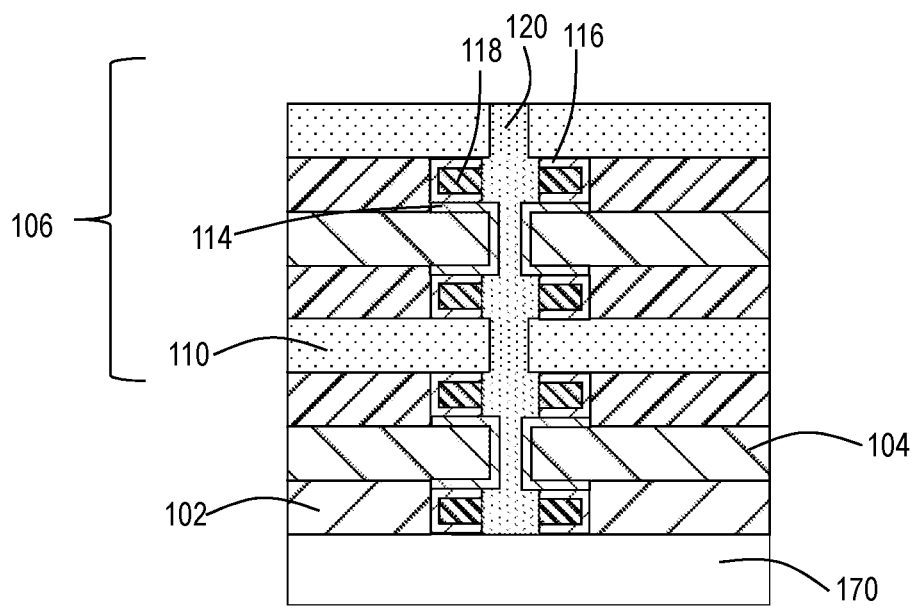

FIG. 3F shows operation 40 of method 10 where the active opening 210 is filled with a fill material 120. The fill material 120 may be any suitable material known to one of skill in the art. In one or more embodiments, the fill material 120 comprises one or more of a dielectric material. As used herein, the term "dielectric material" refers to a layer of material that is an electrical insulator that can be polarized in an electric field. In one or more embodiments, the dielectric material comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

Figure 3G:
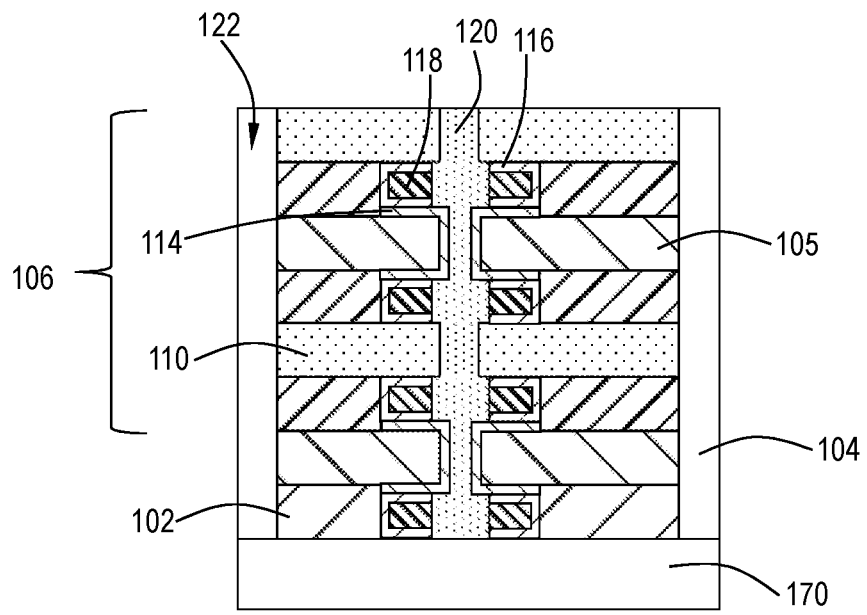

FIG. 3G shows operation 45 of method 10, where the device is slit patterned to form slit pattern openings 122 that extend from a top surface of the memory stack 106 to the substrate 170.

Figure 3H:
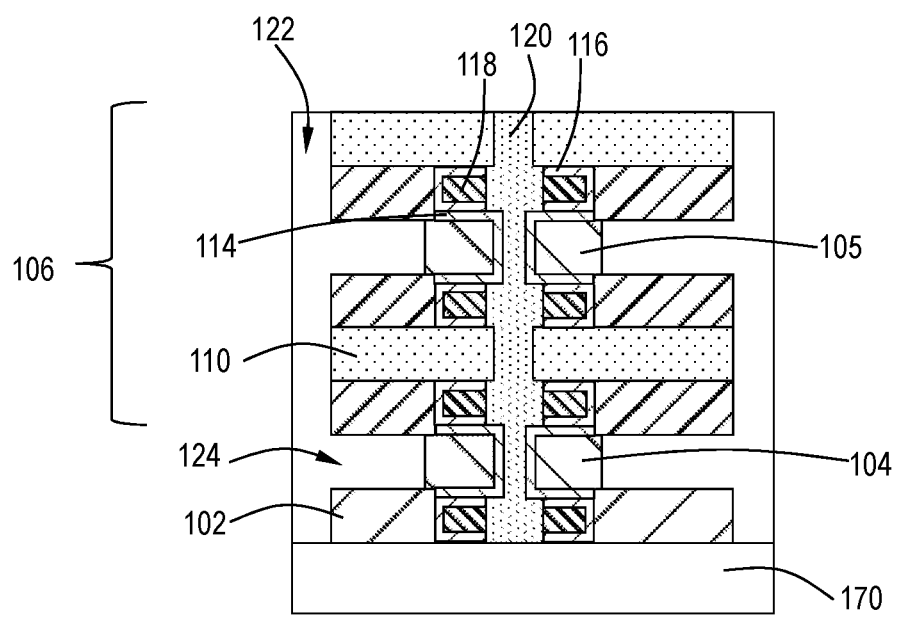

FIG. 3H shows operation 50 of method 10, where the second sacrificial layer 104 and the polysilicon layer 105 are recessed through the slit pattern opening 122 to form openings 124. This process may also be referred to as a "pull back" process. In one or more embodiments, the process shown in FIG. 3H is a poly-silicon pull back.

Figure 3I:
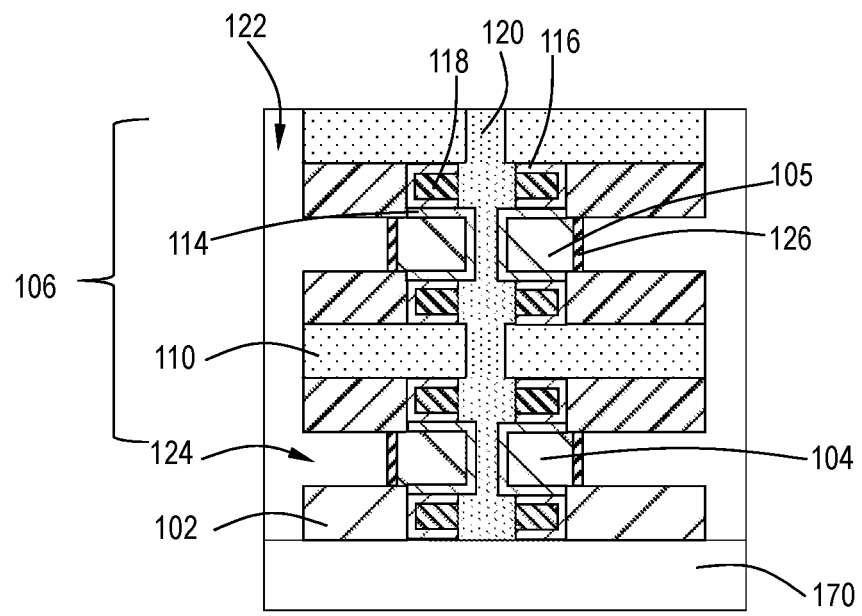

FIG. 3I shows operation 55 of method 10, where the second sacrificial layer 104 and the polysilicon layer 105 are doped, e.g. by a gas phase doping process. The gas phase doping process forms a doped layer 126 on the outer edge of the polysilicon layer 105. In some embodiments, the polysilicon layer 105 is the active region. In some embodiments, doping is performed during deposition of the polysilicon layer 105 material using a dopant source. For example, a phosphorous doped silica glass (PSG) or boron phosphorous doped glass (BPSG) is diffused into the material. In some embodiments, the doped layer 126 has a thickness in the range of from about 1 nm to about 20 nm (measured from the outer edge of the polysilicon layer 105 toward the slit pattern opening 122).

Figure 3J:
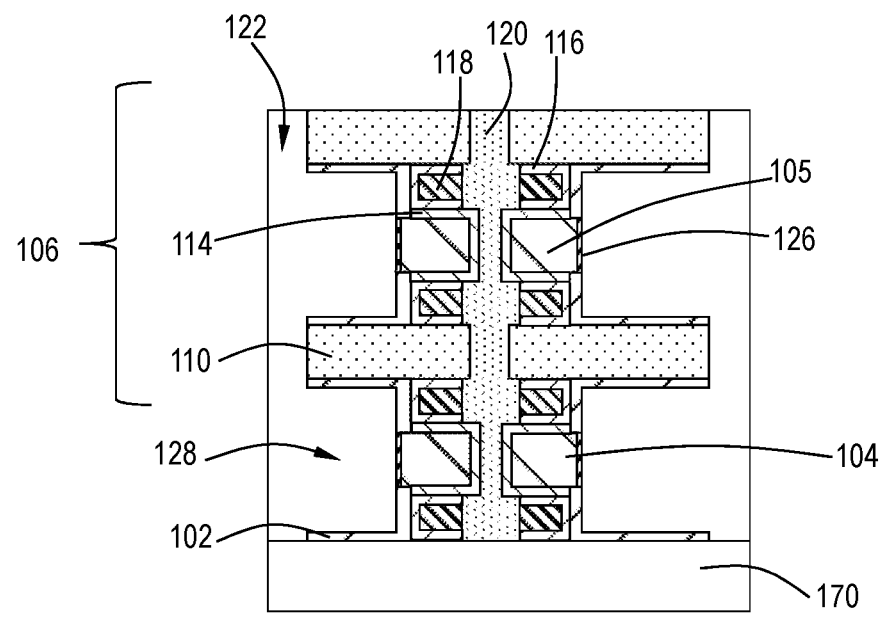
Figure 3K:
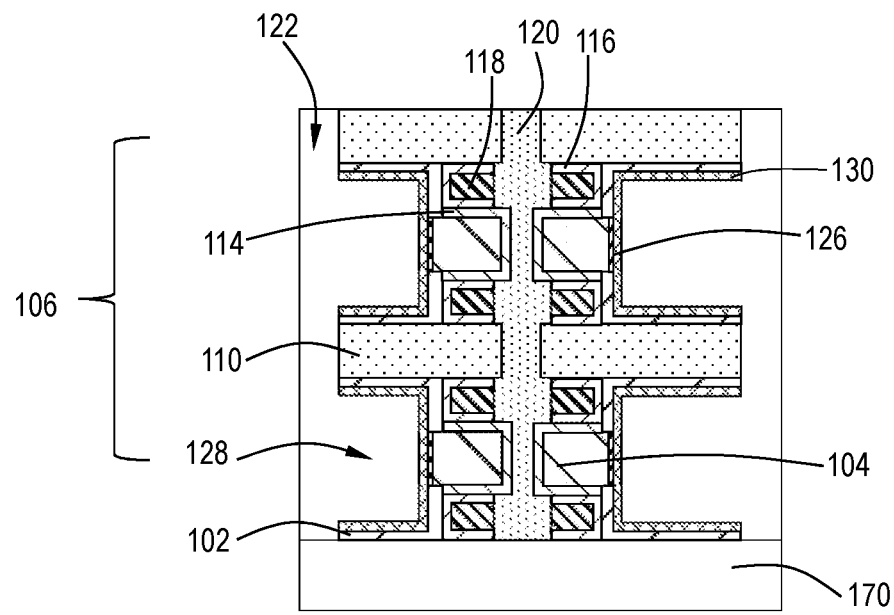
Figure 3L:
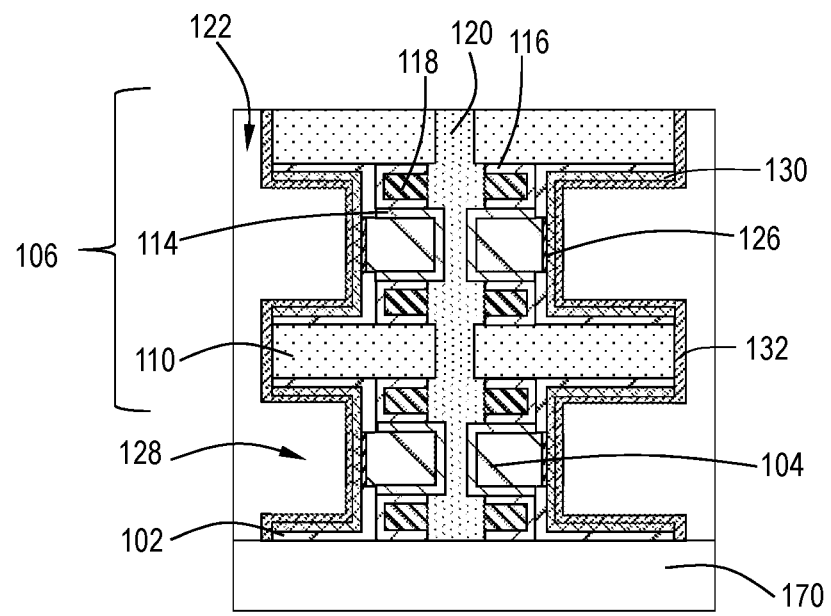
Figure 3M:
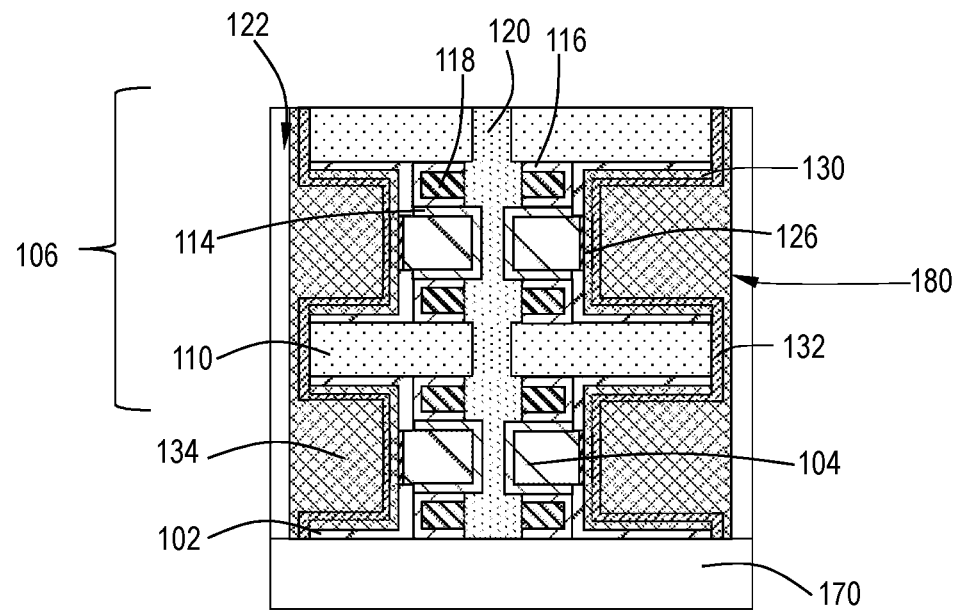

FIGS. 3J through 3N show operation 60 of method 10, where the capacitor is formed. In FIG. 3J, the opening 124 is enlarged prior to forming the capacitor to create a widened capacitor opening 128. The opening 124 can be widened by any suitable technique known to the skilled artisan. After the opening 124 has been widened, a capacitor 180 is formed within, as shown in FIGS. 3K through 3M. The capacitor opening of some embodiments is widened by a percentage of a thickness of the isolation layer (layer between active regions). In some embodiments, the capacitor is widened by an amount in the range of 10% to 80% of the thickness of the isolation layer (measured as the combination of top and bottom widening). In some embodiments, the capacitor is widened by an amount in the range of 20% to 75%, or in the range of 30% to 60%. In some embodiments, the capacitor opening 124 is widened using a dilute HF (~1% HF in water) wet etch. In some embodiments, widening the capacitor opening results in an increase in capacitor surface area in the range of 1% to 85%, or in the range of 5% to 80%, or in the range of 10% to 75%, or in the range of 20% to 60%.

FIG. 2G and FIGS. 3K through 3N, show a capacitor 180 formed in the capacitor opening 128 adjacent the recessed polysilicon layer 105. In some embodiments, the capacitor 180 is formed by first depositing a lower electrode 186 in the capacitor opening 350. The lower electrode 130, also referred to as a bottom electrode or bottom contact, can be formed by any suitable technique known to the skilled artisan. In some embodiments, the lower electrode 130 is a conformal film deposited by atomic layer deposition. In one or more embodiments, the lower electrode 130 comprises a material selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt), and metal nitrides of any of the fore-going metals. For example, in one or more embodiments, the lower electrode 130 comprises a material selected from one or more of copper nitride, cobalt nitride, tungsten nitride, titanium nitride, molybdenum nitride, nickel nitride, ruthenium nitride, silver nitride, gold nitride, iridium nitride, tantalum nitride, or platinum nitride. In some embodiments, the capacitor comprises a bottom electrode, a capacitor dielectric and a top electrode. In some embodiments, the capacitor comprises a double layer. For example, the top electrode and a titanium nitride 130 plus silicon germanium double layer 136.

Referring to FIG. 3L, a high-K dielectric 132 is deposited on the lower electrode 130 within the capacitor opening 180. The high-K dielectric 132 of some embodiments comprises hafnium oxide. In some embodiments, the high-K dielectric 132 is deposited as a conformal film by atomic layer deposition. Referring to FIG. 3M, a top electrode 134 is formed in the capacitor opening 128 within the high-K dielectric 132. The top electrode 134, also referred to as a top contact or upper electrode, can be formed by any suitable technique known to the skilled artisan. In one or more embodiments, the top electrode 134 comprises a conductive material comprising one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt), and metal nitrides of any of the fore-going metals. For example, in one or more embodiments, the lower electrode 130 comprises a material selected from one or more of copper nitride, cobalt nitride, tungsten nitride, titanium nitride, molybdenum nitride, nickel nitride, ruthenium nitride, silver nitride, gold nitride, iridium nitride, tantalum nitride, or platinum nitride. In some embodiments, not illustrated, a dielectric is deposited to fill any open space remaining in the capacitor opening 180 after formation of the top electrode 130. The dielectric of some embodiments separates the individual unit cells from adjacent unit cells to prevent shorting.

Figure 3N:
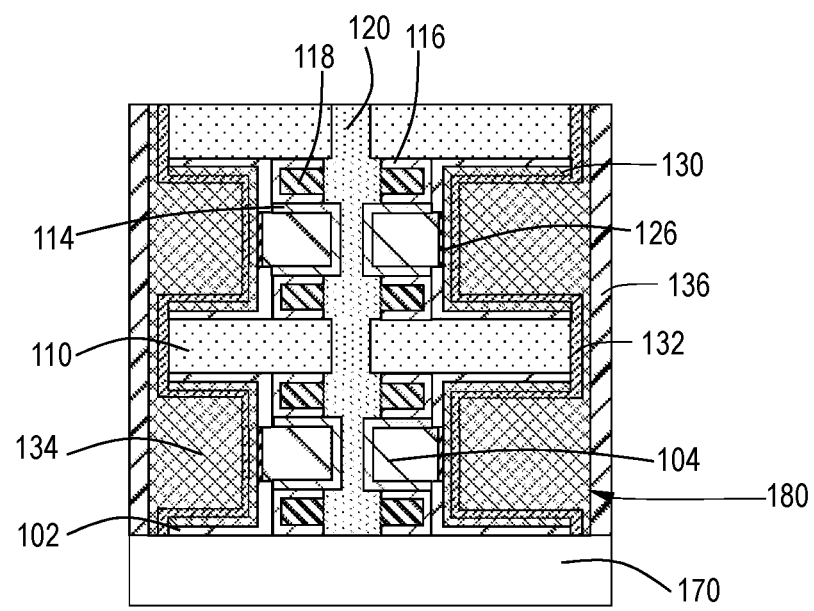

In one or more embodiments, with reference to FIG. 3N, the slit pattern opening 122 is filled with a silicon germanium (SiGe) layer 136 to form capacitor 180 on trop electrode 130.

Figure 3O:
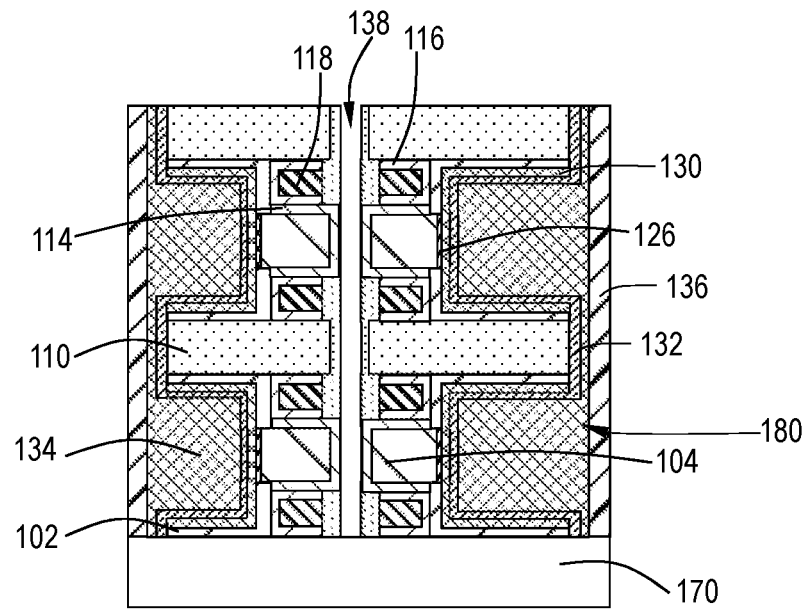

FIG. 3O shows operation 65 of method 10, where a bit line hole 138 (also referred to as a bit line opening) is formed. In some embodiments, the electronic device is patterned to form the plurality of bit line holes 138. The bit line hole 138 can be formed by any suitable process known to the skilled artisan. In some embodiments, the bit line hole 138 is formed by positioning a patterned hard mask and etching the dielectric 120 through the hard mask.

Figure 3P:
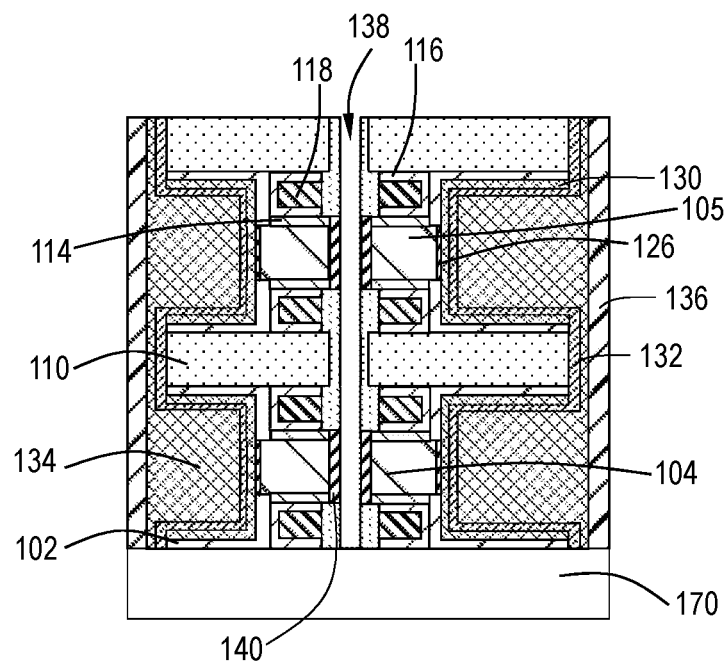

In one or more embodiments, referring to FIG. 3P, the second sacrificial layer 104 and the polysilicon layer 105 are doped, e.g. by a gas phase doping process. The gas phase doping process forms a doped layer 140 on the outer edge of the polysilicon layer 105 and the second sacrificial layer 104. In some embodiments, doping is performed during deposition of the polysilicon layer 105 material using a dopant source. For example, a phosphorous doped silica glass (PSG) or boron phosphorous doped glass (BPSG) is diffused into the material. In some embodiments, the doped layer 140 has a thickness in the range of from about 1 nm to about 20 nm (measured from the outer edge of the polysilicon layer 105 toward the bit line opening 138).

Figure 2H:
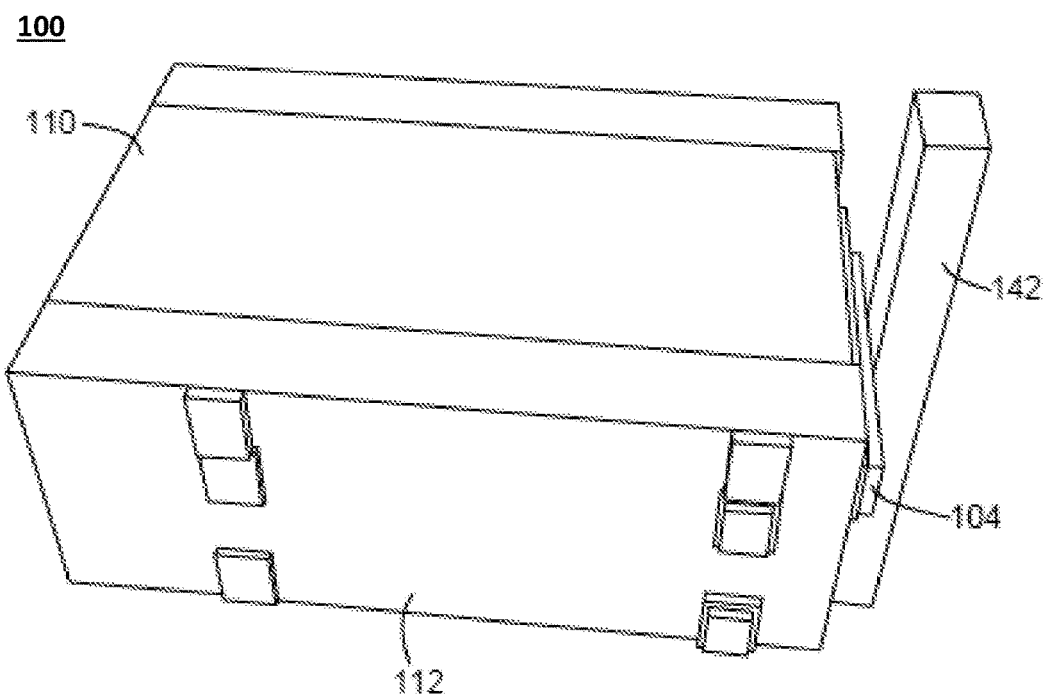
Figure 3Q:
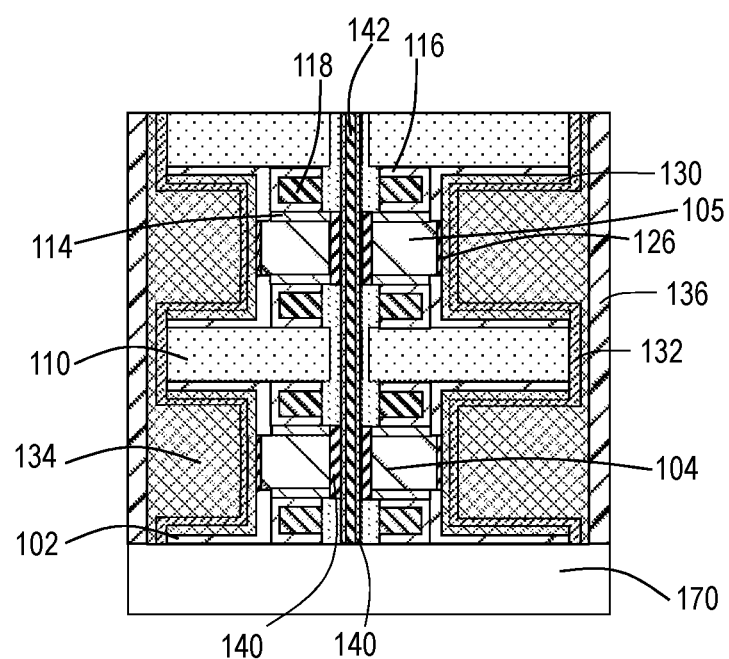

FIG. 2H and FIG. 3Q illustrate operation 70 of method 10, where a bit line 142 is formed in the bit line hole 138. In one or more embodiments, the bit line 142 may include an optional bit line liner (also referred to as a bit line barrier layer) and a bit line metal.

The optional bit line liner can be made of any suitable material deposited by any suitable technique known to the skilled artisan. In some embodiments, the bit line liner is conformally deposited in the plurality of bit line holes 138 and deposited on an exposed surface of the dielectric 120 and the dope surface 140 (or exposed surface) of the active material 105. In one or more embodiments, the bit line liner is deposited on the source/drain region at the inner end of the active material 105. The bit line liner can be any suitable material including, but not limited to, titanium nitride (TiN) or tantalum nitride (TaN). In some embodiments, the optional bit line liner comprises or consists essentially of titanium nitride (TiN). As used in this manner, the term "consists essentially of" means that the composition of the film is greater than or equal to about 95%, 98%, 99% or 99.5% of the stated species. In some embodiments, the optional bit line liner comprises or consists essentially of tantalum nitride (TaN). In some embodiments, the bit line liner is a conformal layer. In some embodiments, the bit line liner is deposited by atomic layer deposition.

In some embodiments, the bit line metal comprises or consists essentially of one or more of tungsten silicide (WSi), tungsten nitride (WN), or tungsten (W). The bit line metal can be deposited by any suitable technique known to the skilled artisan and can be any suitable material. In one or more embodiments, forming the bit line metal further comprises forming a bit line metal seed layer (not shown) prior to depositing the bit line metal.

Figure 4:
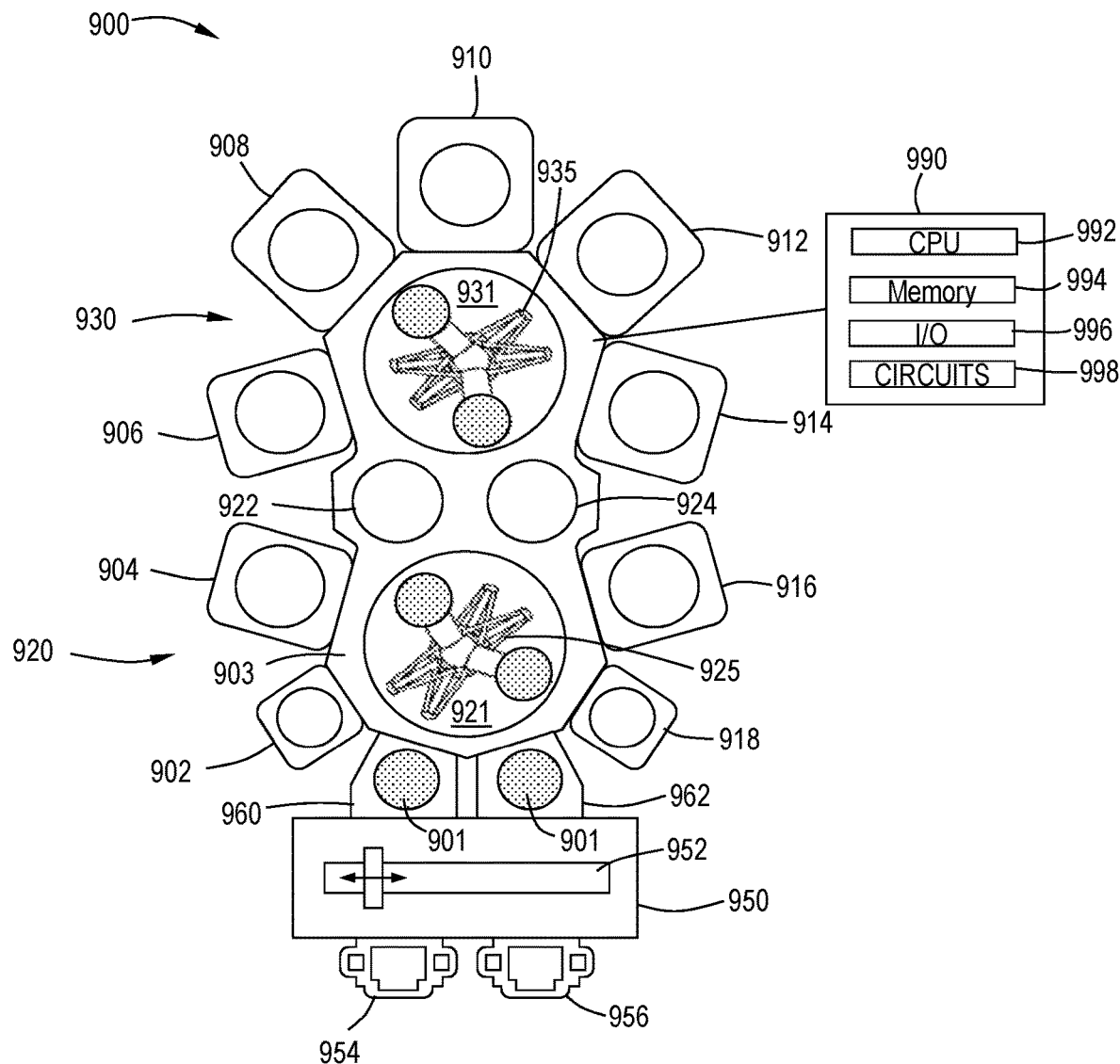
FIG. 4 illustrates a cluster tool according to one or more embodiments.

Additional embodiments of the disclosure are directed to processing tools 900 for the formation of the memory devices and methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective etching chamber, and the like. The particular arrangement of process chambers and components can be varied depending on the cluster tool and should not be taken as limiting the scope of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU), memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A memory device comprising:
a first memory cell, a first active region, a first word line, a first capacitor, and a first bit line, the first memory cell extending along a first direction, a second direction, and a third direction; and
a second memory cell, a second active region, a second word line, a second capacitor, and a second bit line, the second memory extending along the first direction, the second direction, and the third direction, the second memory cell adjacent to and electrically isolated from the first memory cell along the first direction and connected to the first memory cell by at least one support extending in the second direction,
wherein the first memory cell and the second memory cell independently comprise a stack of alternating layers of a first material layer, a second material layer, a semi-conductor material layer, and a sacrificial layer.

2. The memory device of claim 1, wherein the at least one support comprises the first material layer and the second material layer.

3. The memory device of claim 1, wherein the semiconductor material layer comprises a poly-silicon layer.

4. The memory device of claim 1, wherein the first material layer and the second material layer independently comprise an insulating material.

5. The memory device of claim 4, wherein the first material layer comprises a nitride layer and the second material layer comprises an oxide layer.

6. The memory device of claim 5, wherein the first material layer comprises silicon nitride and the second material layer comprises silicon oxide.

7. A method of forming a memory device, the method comprising:
   forming a memory stack, the memory stack extending along a first direction, a second direction, and a third direction and comprising a sacrificial layer, and alternating layers of a first material layer, a second material layer, and a semiconductor material layer; and
   patterning the memory stack along the first direction to form at least one support extending along the second direction, the at least one support comprising the sacrificial layer, the first material layer, the second material layer, and the semiconductor material layer.

8. The method of claim 7, further comprising removing the semiconductor material layer from the support to form an opening.

9. The method of claim 8, further comprising depositing an insulating layer to fill the opening.

10. The method of claim 9, wherein the insulating layer comprises silicon oxide.

11. The method of claim 7, wherein the first material layer and the second material layer independently comprise an insulating material.

12. The method of claim 11, wherein the first material layer comprises a nitride layer and the second material layer comprises an oxide layer.

13. The method of claim 12, wherein the first material layer comprises silicon nitride and the second material layer comprises silicon oxide.

14. The method of claim 7, wherein the semiconductor material layer comprises a poly-silicon layer.

15. The method of claim 9, further comprising forming an active opening through the memory stack and recessing the first material layer through the opening.

16. The method of claim 15, further comprising:
   depositing a gate oxide layer;
   forming a word line, the word line comprising one or more of a barrier layer and a word line metal;
   depositing a fill material in the active opening;
   forming a capacitor opening through the memory stack;
   forming a capacitor in the capacitor opening;
   forming a bit line opening in the fill material; and
   forming a bit line in the bit line opening.

17. The method of claim 16, wherein forming the capacitor opening comprises slit patterning the memory stack and depositing one or more of a lower electrode, a high-k dielectric layer, a top electrode, and a silicon germanium (SiGe) layer.

18. A non-transitory computer readable medium including instructions, that, when executed by a controller of a processing chamber, causes the processing chamber to perform the operations of:
   form a memory stack, the memory stack extending along a first direction, a second direction, and a third direction and comprising a sacrificial layer, and alternating layers of a first material layer, a second material layer, and a semiconductor material layer; and
   pattern the memory stack along the first direction to form at least one support extending along the second direction, the at least one support comprising the sacrificial layer, the first material layer, the second material layer, and the semiconductor material layer.

19. The non-transitory computer readable medium of claim 18 that includes further instructions that, when executed by a controller of a processing chamber, causes the processing chamber to perform the further operations of:
   remove the semiconductor material layer from the support to form an opening;
   deposit an insulating layer to fill the opening;
   form an active opening through the memory stack;
   recess the first material layer through the active opening;
   deposit a gate oxide layer;
   form a word line, the word line comprising one or more of a barrier layer and a word line metal;
   deposit a fill material in the opening;
   form a capacitor opening through the memory stack;
   form a capacitor in the capacitor opening;
   form a bit line opening in the fill material; and
   form a bit line in the bit line opening.

* * * * *

UNITED STATES PATENT AND TRADEMARK OFFICE
CERTIFICATE OF CORRECTION

PATENT NO. : 11,594,537 B2
APPLICATION NO. : 17/354254
DATED : February 28, 2023
INVENTOR(S) : Chang Seok Kang et al.

It is certified that error appears in the above-identified patent and that said Letters Patent is hereby corrected as shown below:

In the Specification

•Column 07, Line 13, replace "$CD_b$" after "region" and before "is" with "$CD_c$".

Signed and Sealed this
Eighteenth Day of April, 2023

Katherine Kelly Vidal
*Director of the United States Patent and Trademark Office*